(12) United States Patent
Moogat et al.

(10) Patent No.: US 7,489,548 B2
(45) Date of Patent: Feb. 10, 2009

(54) NAND FLASH MEMORY CELL ARRAY WITH ADAPTIVE MEMORY STATE PARTITIONING

(75) Inventors: Farookh Moogat, Fremont, CA (US); Teruhiko Kamei, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/618,498

(22) Filed: Dec. 29, 2006

(65) Prior Publication Data

US 2008/0158969 A1      Jul. 3, 2008

(51) Int. Cl.
*G11C 16/04* (2006.01)
(52) U.S. Cl. .............................. 365/185.17; 365/185.18; 365/185.23
(58) Field of Classification Search ............ 365/185.17, 365/185.18, 185.03
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 6,046,935 A | 4/2000 | Takeuchi et al. | |
| 6,456,528 B1 | 9/2002 | Chen | |
| 6,459,114 B1 * | 10/2002 | Nakamura et al. | .......... 257/298 |
| 6,522,580 B2 | 2/2003 | Chen et al. | |
| 2001/0038118 A1 | 11/2001 | Sakui et al. | |
| 2005/0122780 A1 | 6/2005 | Chen et al. | |
| 2006/0198195 A1 | 9/2006 | Hemink et al. | |
| 2007/0247909 A1 | 10/2007 | Kamei | |

OTHER PUBLICATIONS

USPTO, "Office Action," mailed in related U.S. Appl. No. 11/618,482 on Mar. 21, 2008, 9 pages.
EPO/ISA, "Notification of Transmittal of the International Search Report and the Written Opinion of the International Searching Authority, or the Declaration," corresponding International Application No. PCT/US2007/087262, mailed on Apr. 29, 2008, 12 pages.
USPTO, "Notice of Allowance and Fee(s) Due," corresponding U.S. Appl. No. 11/618,482, mailed on Oct. 7, 2008, 8 pages.

* cited by examiner

*Primary Examiner*—Huan Hoang
(74) *Attorney, Agent, or Firm*—Davis Wright Tremaine LLP

(57) ABSTRACT

A NAND type flash memory is organized into NAND strings with each being a chain of memory cells in series and connected via select transistors on both ends of the string to either a bit line or a source line. The memory cells adjacent both ends of a NAND string are particularly susceptible to errors due to program disturb. An adaptive memory-state partitioning scheme is employed to overcome the errors, in which each memory cells are generally partitioned to store multiple bits of data, except for the ones adjacent both ends where relatively less bits are stored. In this way, the storage of relatively less bits in the memory cells adjacent both ends of a NAND string affords sufficient margin to overcome the errors. For example, in a memory designed to store 2-bit data, the cells adjacent both ends of a NAND string would each be configured to store one bit of the 2-bit data.

22 Claims, 21 Drawing Sheets

Overcome GIDL induced program disturb by adaptive memory state partitioning

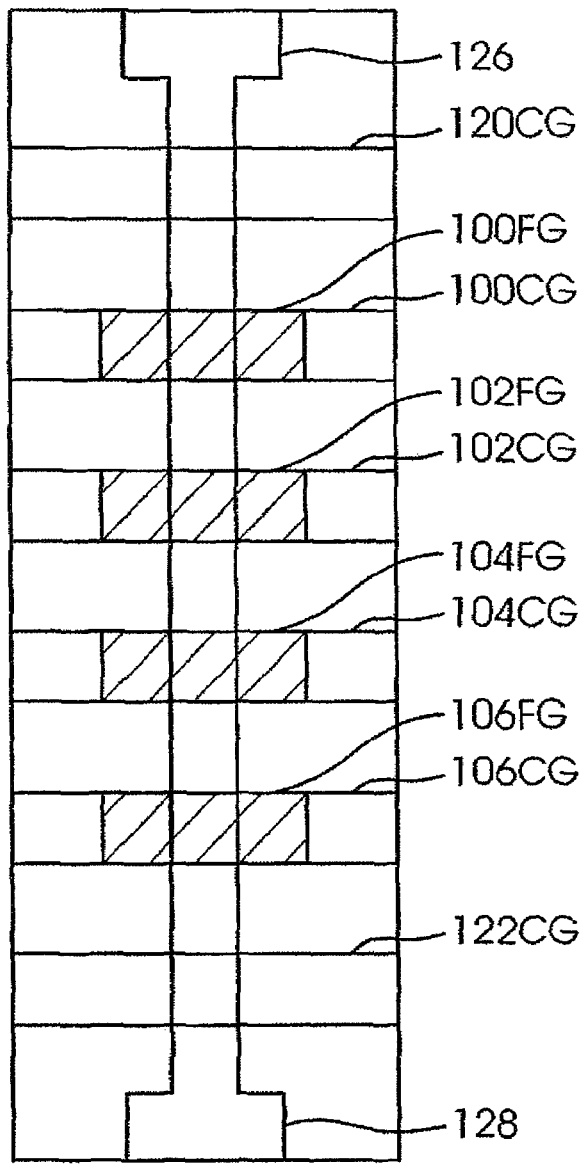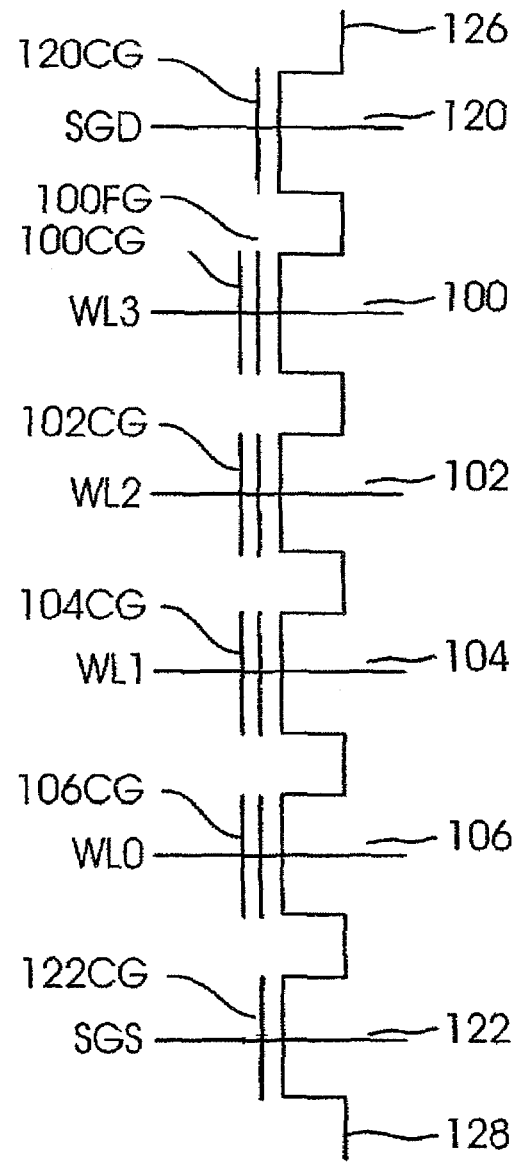
Fig. 1A
Fig. 1B

Multistate Memory (Conventional Gray Code)

Lower Page Programming (Conventional Gray Code)

Upper Page Programming (Conventional Gray Code)

Lower Page Read (Conventional Gray Code)

Upper Page Read (Conventional Gray Code)

Multistate Memory (LM Gray Code)

Lower Page Programming (LM Gray Code)

Upper Page Programming (LM Gray Code)

Lower Page Read (LM Gray Code)

Upper Page Read (LM Gray Code)

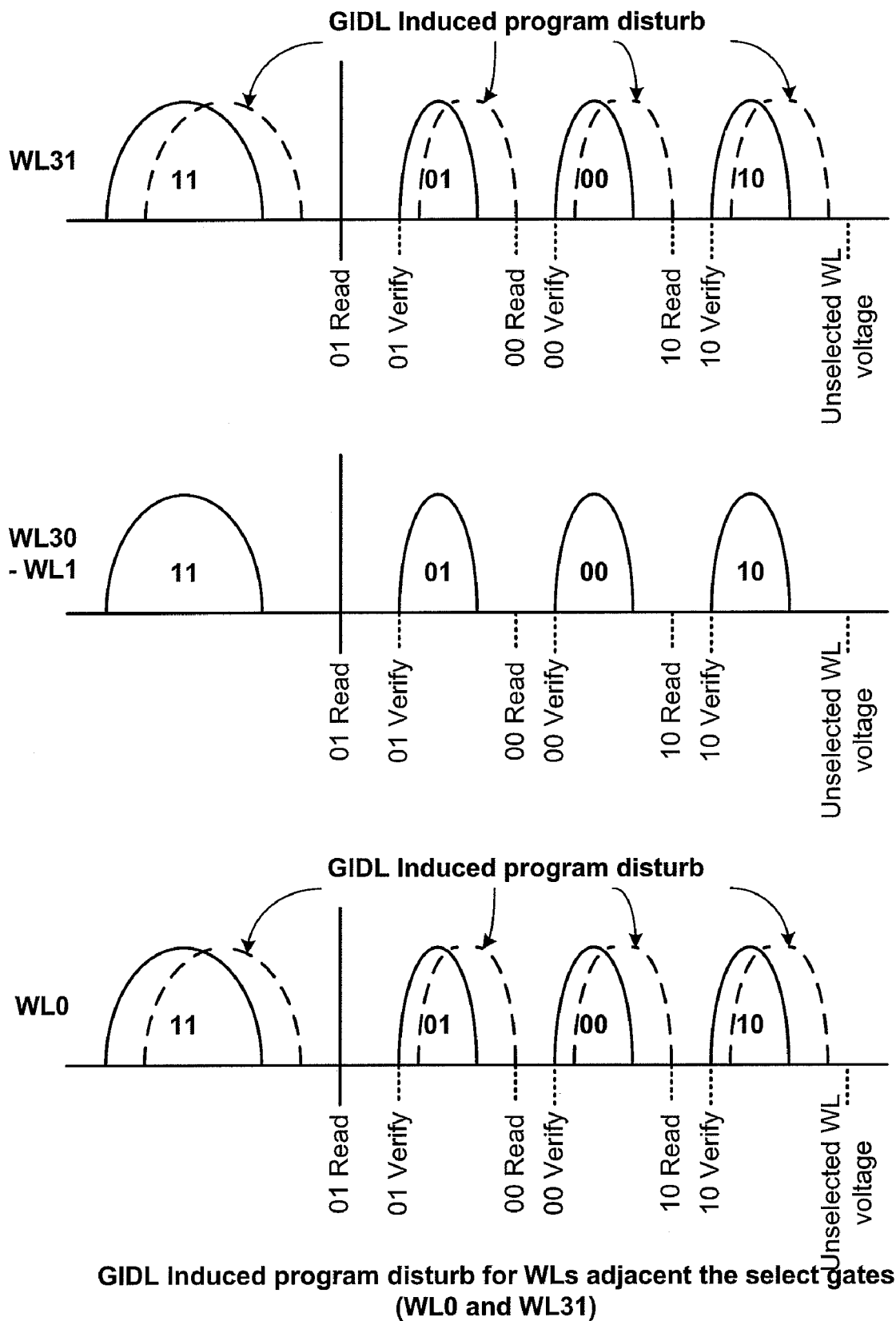
FIG. 6A (CONVENTIONAL)

| Word Line | Even Columns | Odd Columns |
|---|---|---|
| WL31 | L/U | L/U |
| WL30 | L/U | L/U |
| WL29 | L/U | L/U |
| ... | ... | ... |
| ... | ... | ... |
| ... | ... | ... |
| WL2 | L/U | L/U |
| WL1 | L/U | L/U |
| WL0 | L/U | L/U |

32-cell String

32 Regular WLs

KEY:

L/U: *Both Lower/Upper Pages can be programmed*

*FIG. 6B* (CONVENTIONAL)

| Word Line | Even Columns | Odd Columns |
|---|---|---|
| WL31 | L/U | L/U |
| WL30 | L/U | L/U |
| WL29 | L/U | L/U |
| ... | ... | ... |
| ... | ... | ... |
| ... | ... | ... |
| WL2 | L/U | L/U |
| WL1 | L/U | L/U |
| WL0 | L/U | L/U |
| Dummy | E | E |

33-cell String

32 Regular WLs + 1 Dummy WL
(PREVIOUS SOLUTION)

KEY:

L/U: *Both Lower/Upper Pages can be programmed*
E: *Never programmed*

*FIG. 7B*

| Word Line | Even Columns | Odd Columns |
|---|---|---|
| Dummy | E | E |
| WL31 | L/U | L/U |
| WL30 | L/U | L/U |
| WL29 | L/U | L/U |
| ... | ... | ... |
| ... | ... | ... |
| ... | ... | ... |
| WL2 | L/U | L/U |
| WL1 | L/U | L/U |
| WL0 | L/U | L/U |
| Dummy | E | E |

34-cell String

32 Regular WLs + 3 Dummy WLs
(PREVIOUS SOLUTION)

KEY:
    L/U: *Both Lower/Upper Pages can be programmed*
    E: *Never programmed*

*FIG. 7C*

| Word Line | Even Columns | Odd Columns |
|---|---|---|
| WL32 | Binary | Binary |
| WL31 | L/U | L/U |
| WL30 | L/U | L/U |
| WL29 | L/U | L/U |
| ... | ... | ... |
| ... | ... | ... |
| ... | ... | ... |
| WL2 | L/U | L/U |
| WL1 | L/U | L/U |
| WL0 | Binary | Binary |

33-cell String

30 Regular (L/U) + 2 Regular (Binary)

KEY:
  L/U: *Both Lower/Upper Pages can be programmed*
Binary: *Programmed as binary cell*

*FIG. 8B*

| Word Line | Even Columns | Odd Columns |
|---|---|---|
| WL32 | L | L |
| WL31 | L/U | L/U |
| WL30 | L/U | L/U |
| WL29 | L/U | L/U |
| ... | ... | ... |
| ... | ... | ... |
| ... | ... | ... |
| WL2 | L/U | L/U |
| WL1 | L/U | L/U |
| WL0 | L | L |

33-cell String

30 Regular (L/U) + 2 Regular (L)

KEY:

L/U: *Both Lower/Upper Pages can be programmed*

L: *Only Lower Page can be programmed*

*FIG. 8C*

ADAPTIVE MEMORY-STATE PARTITIONING IN A NAND STRING

NAND FLASH MEMORY CELL ARRAY WITH ADAPTIVE MEMORY STATE PARTITIONING

CROSS REFERENCE TO RELATED APPLICATION

This application is related to an application No. 11/618,482, filed on Dec. 29, 2006, by Farookh Moogat and Teruhiko Kamei, entitled "Method of Nand Flash Memory Cell Array With Adaptive Memory State Partitioning," publication No. 2008/0158968 A1, which application is incorporated herein in its entirety by this reference.

FIELD OF THE INVENTION

This invention relates generally to non-volatile semiconductor memories of the flash EEPROM (Electrically Erasable and Programmable Read Only Memory) type, and more particularly to structures and methods of operating NAND types of memory cell arrays and for dealing with program disturb near the edge of a NAND string.

BACKGROUND OF THE INVENTION

There are many commercially successful non-volatile memory products being used today, particularly in the form of small form factor cards, which use an array of flash EEPROM cells.

One example of a flash memory system uses the NAND structure, which includes arranging multiple charge-storage transistors acting as memory cells in series, sandwiched between two select gates. A NAND array has a number of memory cells, such as 8, 16, or even 32, connected in as a string of memory cells (NAND string) between a bit line and a reference potential through select transistors at either end. Word lines are connected with control gates of cells in different series strings.

To program a flash memory cell, a program voltage is applied to the control gates and the bit line is grounded causing the threshold voltage of the cell to be raised. Because the program voltage is applied to all cells connected to a word line an unselected cell (a cell that is not to be programmed) on the word line may become inadvertently programmed. The unintentional programming of the unselected cell on the selected word line is referred to as "program disturb."

Continuous efforts are being made to improve programming techniques of NAND memory cells so that more information can be stored efficiently and program disturbs are prevented.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF THE INVENTION

A NAND type flash memory is organized into NAND strings with each being a chain of memory cells in series and connected via select transistors on both ends of the string to either a bit line or a source line. The memory cells adjacent both ends of a NAND string are particularly susceptible to errors due to program disturb. An adaptive memory-state partitioning scheme is employed to overcome the errors, in which each memory cells are generally partitioned to store multiple bits of data, except for the ones adjacent both ends where relatively less bits are stored. In this way, the storage of relatively less bits in the memory cells adjacent both ends of a NAND string affords sufficient margin to overcome the errors.

In one embodiment, where a memory is designed to store two bits per cell, one unit of such two bits is able to have one of the two bits stored in a memory cell adjacent to one end of a NAND string and another of the two bits stored in another memory cell adjacent the other end.

In another embodiment, where a memory is designed to store three bits per cell, one unit of such three bits is able to have one end memory cell stores two of the bits and the other end memory cell stores one of the bits.

One advantage of the invention is that an existing memory system is easily modified to accommodate the adaptive scheme. For a 2-bit or 3-bit memory system, at most one additional memory cell needs to be added to an existing NAND chain in order to maintain the same memory capacity.

Additional features and advantages of the present invention will be understood from the following description of its preferred embodiments, which description should be taken in conjunction with the accompanying drawings.

BRIEF DESCRIPTION OF THE DRAWINGS

FIG. 1A is a top view of a NAND string;

FIG. 1B is an equivalent circuit diagram of the NAND string;

FIG. 6A illustrates the effect of GIDL induced errors among the various memory cells in a conventional NAND string.

FIG. 6B illustrates the memory-state partitioning of each of the memory cells in a typical NAND string associated with FIG. 6A.

FIG. 7B illustrates the memory-state partitioning of each of the memory cells in a typical NAND string with the addition of a dummy cell similar to that of FIG. 7A.

FIG. 7C illustrates the memory-state partitioning of each of the memory cells in a typical NAND string with the addition of two dummy cells similar to that of FIG. 7A.

FIG. 8B illustrates the memory-state partitioning of each of the memory cells in a typical NAND string with the adaptive memory-state partitioning scheme of FIG. 8A.

FIG. 8C illustrates an alternate preferred scheme using the 2-bit LM coding described in FIGS. 5A-5E.

DETAILED DESCRIPTION OF EXEMPLARY EMBODIMENTS

To facilitate an understanding of the preferred embodiment, the general architecture and operation of a NAND string will be described. The specific architecture and operation of the preferred embodiment will then be described with reference to the general architecture.

General Description of the NAND Structure

FIG. 1A shows a top-view of a NAND structure where multiple transistors in series are sandwiched between two select gates. The transistors in series and the select gates are referred to as a NAND string. (Transistor and gates are also referred to nonvolatile storage elements.) FIG. 1A shows a 4-memory cell NAND string. FIG. 1B shows an equivalent circuit of FIG. 1A.

The NAND string depicted in FIGS. 1A and 1B includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG for select gate 120. Select gate 122 is controlled by applying the appropriate voltages to control gate 122CG of select gate 122. Each of the transistors 100, 102, 104 and 106 has a control gate and a floating gate. For example, transistor 100 includes control gate 100CG and floating gate 100FG. Transistor 102 includes control gate 102CG and a floating gate 102FG. Transistor 104 includes control gate 104CG and floating gate 104FG. Transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Figure 1C:
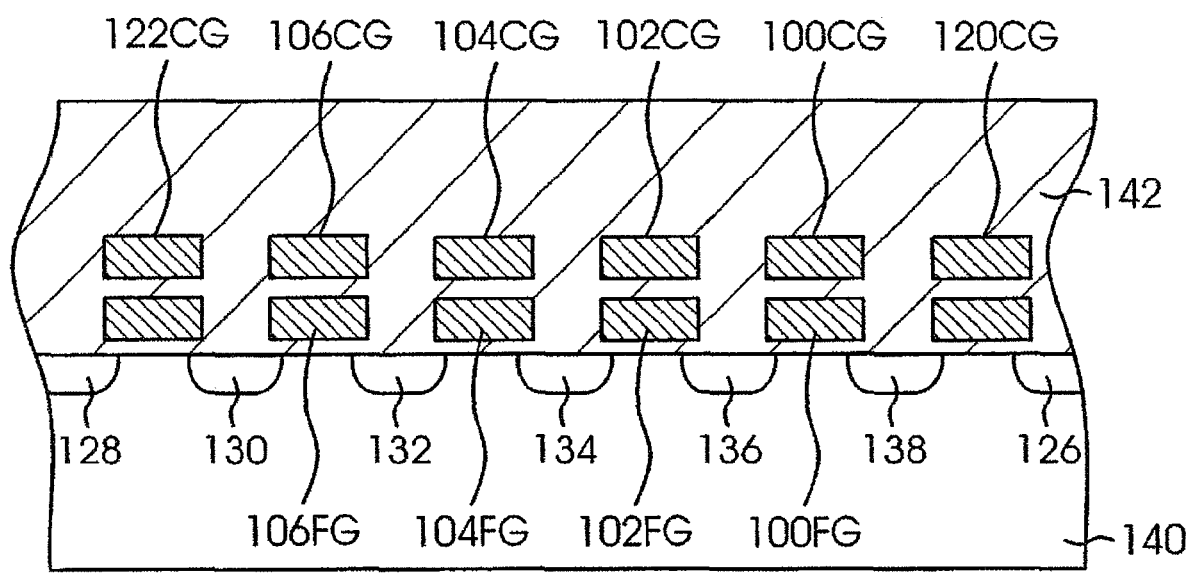
FIG. 1C is a cross sectional view of the NAND string of FIG. 1A.

FIG. 1C is a cross-sectional view of the NAND string 142 described above. As depicted in FIG. 1C, the transistors (also called cells or memory cells) of the NAND string are formed in p-well region 140. Each transistor includes a stacked gate structure that consists of control gate (100CG, 102CG, 104CG and 106CG) and floating gate (100FG, 102FG, 104FG and 106FG). The floating gates are formed on the surface of p-well region 140 on top of an oxide film. The control gate is above the floating gate, with an oxide layer separating the control gate and floating gate.

Note that FIG. 1C appears to depict a control gate and floating gate for the select transistors 120 and 122. However, for transistors 120 and 122, the control gate and the floating gate are connected together. The control gates of memory cells (100, 102, 104, and 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1A-1C shows four memory cells in the NAND string, the use of four transistors is only provided as an example. A NAND string can have less than four memory cells or more than four memory cells. For example, some NAND strings will include 8 memory cells (as shown and described below with respect to FIGS. 2B-2F), 16 memory cells, 32 memory cells, etc. The discussion herein is not limited to any particular number of memory cells in a NAND string.

Figure 2A:
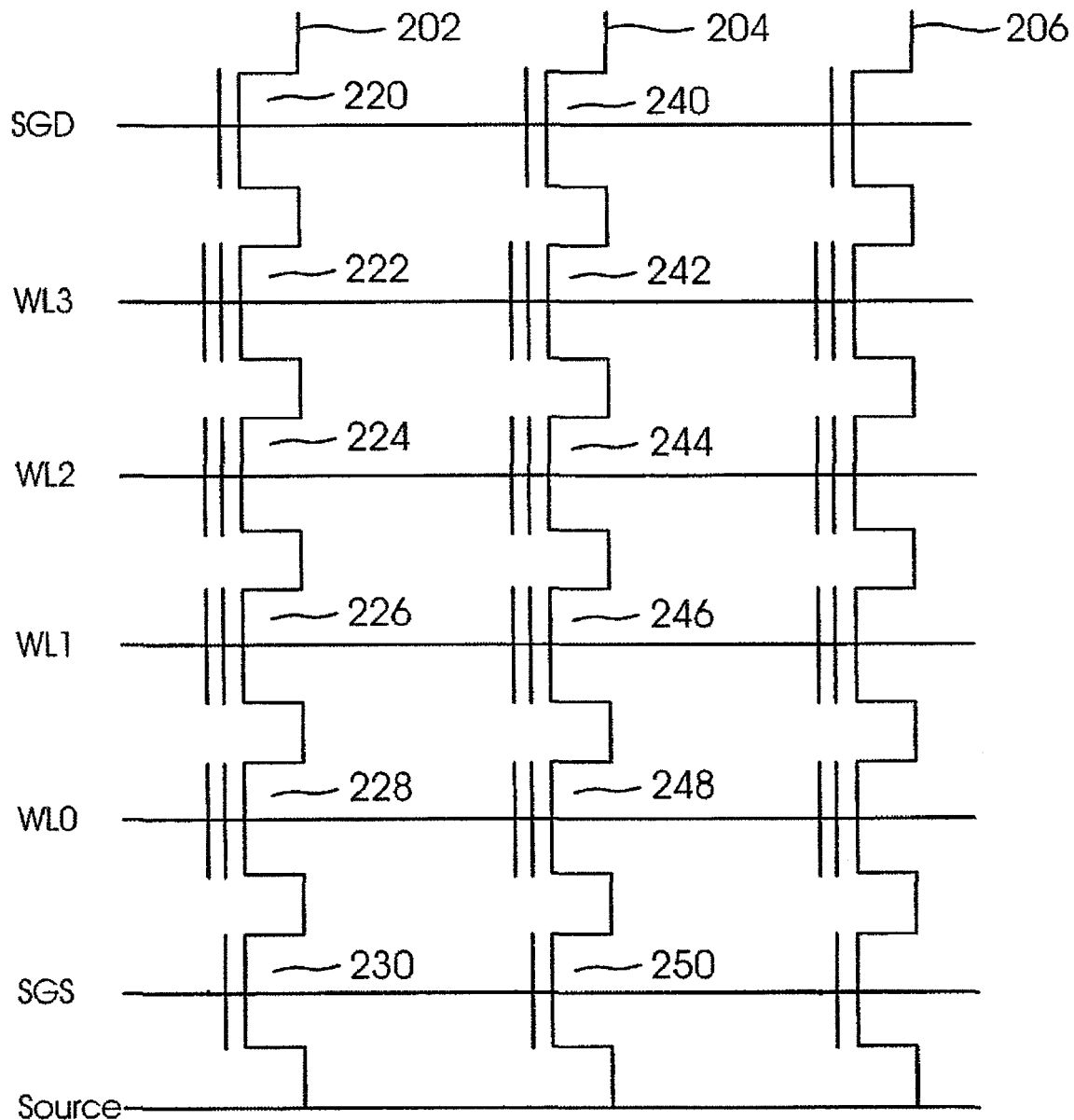
FIG. 2A is a circuit diagram depicting three NAND strings.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 Includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD.

In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226, memory cell 246 and memory cell 250. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array and each word line connects the control gates of each memory cell in the row as described above.

Figure 2B:
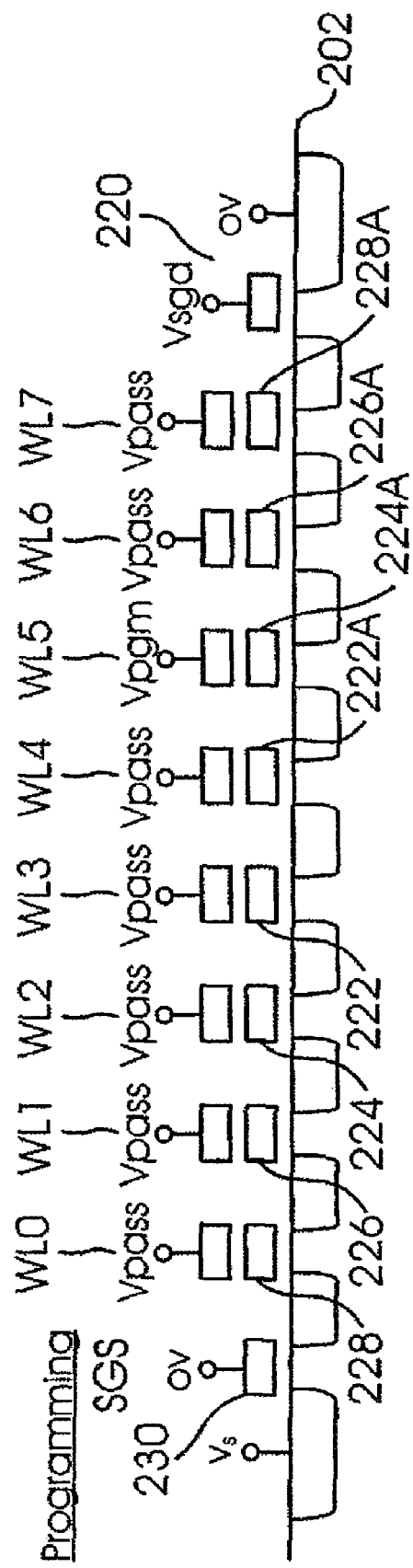
FIG. 2B shows an 8-cell NAND string being programmed.

FIG. 2B shows an example of an 8 memory cell NAND string. The additional word lines are shown as WL4-WL7 (for memory cells 222A-228A) and have similar functionality as word lines WL0-WL3.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored.

A memory cell can also store multiple levels of information (or "data"), for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference: U.S. Pat. Nos. 5,570,315; 5,774,397, 6,046,935, 6,456,528 and 6,522,580.

Program Disturb

When programming a flash memory cell, a program voltage is applied to the control gate and the bit line is grounded. Electrons from the p-well are injected into the floating gate. When electrons accumulate in the floating gate, the floating gate becomes negatively charged and the threshold voltage of the cell is raised. To apply the program voltage to the control gate of the cell being programmed, that program voltage is applied on the appropriate word line. As discussed above, that word line is also connected to one cell in each of the other NAND strings that utilize the same word line. For example, when programming cell 224 of FIG. 2A, the program voltage will also be applied to the control gate of cell 244 because both cells share the same word line.

A problem arises when it's desired to program one cell on a word line without programming other cells connected to the same word line, for example, when it's desired to program cell 224 and not cell 244. Because the program voltage is applied to all cells connected to a word line an unselected cell (a cell that is not to be programmed) on the word line may become inadvertently programmed. For example, when programming cell 224, there is a concern that cell 244 might unintentionally be programmed. The unintentional programming of the unselected cell on the selected word line is referred to as "program disturb."

Figure 2C:
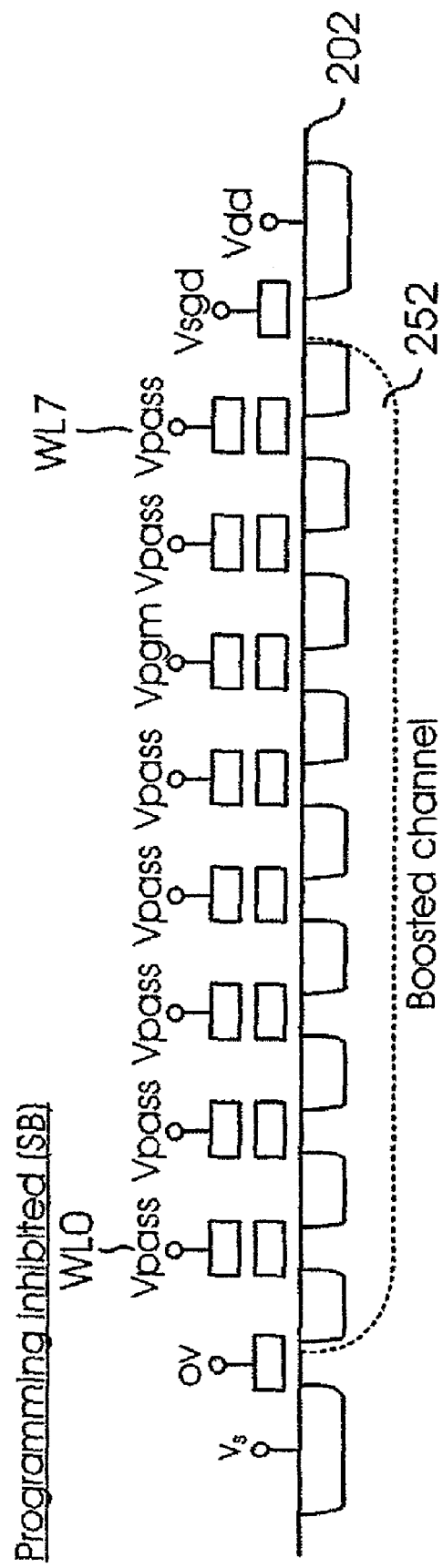
FIG. 2C shows the affect of a self boosting technique for an 8-cell NAND string.

Several techniques can be employed to prevent program disturb. In one method known as "self boosting," the unselected bit lines are electrically isolated and a pass voltage (e.g. 10 volts) is applied to the unselected word lines during programming. The unselected word lines couple to the unselected bit lines, causing a voltage (e.g. eight volts) to exist in the channel of the unselected bit lines, which tends to reduce program disturb. Self boosting causes a voltage boost to exist in the channel which tends to lower the voltage across the tunnel oxide and hence reduce program disturb. FIG. 2C shows an example of the self-boosting technique with a boosted channel 252.

A NAND string is typically (but not always) programmed from the source side to the drain side, for example, from memory cell 228 to memory cell 228A. When the programming process is ready to program the last (or near the last) memory cell of the NAND string, if all or most of the previously programmed cells on the string being inhibited (e.g. string 204) were programmed, then there is negative charge in the floating gates of the previously programmed cells. Because of this negative charge on the floating gates, the boosting potential doesn't get high enough and there still may be program disturb on the last few word lines. For example, when programming cell 222, if cells 248, 246 and 244 were programmed, then each of those transistors (244, 246, and 248) has a negative charge on their floating gate which will limit the boosting level of the self boosting process and possibly cause program disturb on cell 242.

Local Self Boosting ("LSB") and Erased Area Self Boosting ("EASB")

The problem discussed above with self boosting has been addressed by two other schemes: Local Self Boosting ("LSB") and Erased Area Self Boosting ("EASB"), Both LSB and EASB attempt to isolate the channel of previously programmed cells from the channel of the cell being inhibited. For example, if cell 224 of FIG. 2A (or FIG. 2B) is being programmed, LSB and EASB attempt to inhibit programming in cell 244 by isolating the channel of cell 244 from the previously programmed cells (246 and 248).

With the LSB technique, the bit line for the cell being programmed is at ground and the bit line of the string with the cell being inhibited is at Vdd. The program voltage Vpgm (e.g. 20 volts) is driven on the selected word line. The word lines neighboring the selected word line are at zero volts and the remaining non-selected word lines are at Vpass. For example, looking at FIG. 2A, bit line 202 is at zero volts and bit line 204 is at Vdd. Drain select SGD is at Vdd and source select SGS is at zero volts. Selected word line WL2 (for programming cell 224) is at Vpgm. Neighboring word lines WL1 and WL3 are at zero volts, and other word lines (e.g. WL0) are at Vpass. The same is shown in FIG. 2B for an 8-memory cell NAND string.

Figure 2D:
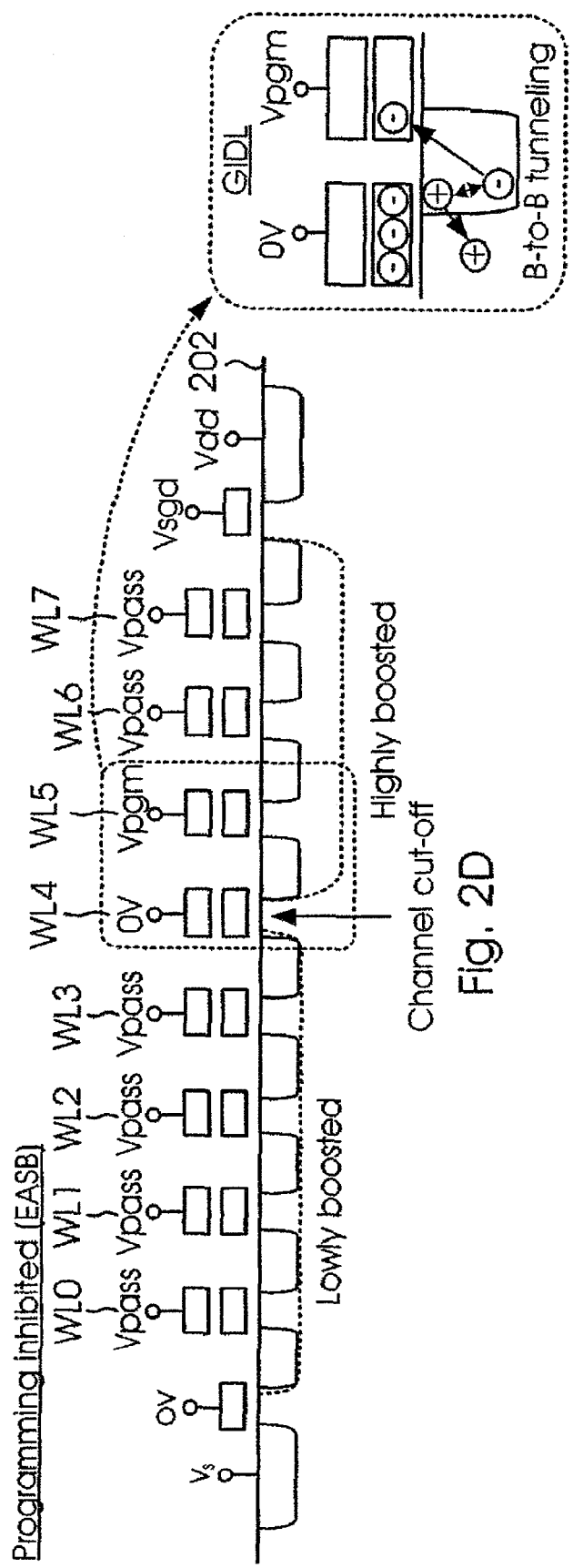
FIG. 2D shows the GIDL effect for a 8-cell NAND string.

EASB is similar to LSB with the exception that only the source side neighbor word line is at zero volts. FIG. 2D shows an example of EASB. When WL5 is being programmed, WL4 is at zero volts, which cuts-off the channel and WL3 is at Vpass. In one embodiment, Vpass is 7-10 volts. If Vpass is too low, boosting in the channel is insufficient to prevent program disturb. If Vpass is too high, unselected word lines will be programmed.

Gate Induced Drain Leakage (GIDL)

While LSB and EASB provide an improvement over self boosting, they also present a problem that depends on whether the source side neighbor cell (cell 246 is the source side neighbor of cell 244) is programmed or erased. If the source side neighbor cell is programmed, then there is a negative charge on the floating gate of that source side neighbor cell. Zero volts are applied to the control gate. Thus, there is a highly reverse biased junction under the negatively charged gate which can cause Gate Induced Drain Leakage (GIDL). GIDL involves electrons leaking into the boosted channel due to band-to band (B-to-B tunneling). GIDL occurs with a large bias in the junction and a low or negative gate voltage, which is precisely the case when the source side neighbor cell is programmed and the drain junction is boosted. GIDL will cause the boosted voltage to leak away prematurely, resulting in a programming error. GIDL is more severe with the abruptly and highly doped junctions, which are required as cell dimensions are scaled. If the leakage current is high enough, the boosting potential in the channel region will go down and there can be program disturb. The closer the word line being programmed is to the drain, the less charge is present in the boosted junction. Thus, the voltage in the boosted junction will drop quickly, causing a program disturb. Even if the leakage current is not high enough, electrons induced by GIDL are easily injected into the floating gate in a high electric field between the gate and the channel. It will also cause program disturb.

FIG. 2D shows an example of GIDL when Vpgm is applied to WL5, WL4 is at zero volts and Vpass is applied to the other word lines. Positive charges are shown as having leaked into p-well and electrons left are shown as having been injected into the floating gate.

With further shrinking of the word line spacing to achieve smaller die-size, more issues would appear at some points of lithography, noise due to WL-SG (coupling between word line and select gate), and program disturb caused by GIDL. For example, with the word line shrink, the WL-SG coupling capacitance would increase. This will result in longer waiting time before the coupling noise subsides.

Also, since electric field concentration would become higher with the word line shrink, GIDL errors would be even more pronounced when programming the memory cells located at both ends of a NAND string.

In previous approaches, the spacing between the select gate transistor (e.g., select transistor 230 in FIG. 2A) and the adjacent memory transistor (e.g., memory cell 228) is made wider to relax electric field concentration and to reduce WL-SG coupling noise. However, it makes the NAND string length longer, and goes against the desire for die-size shrinkage. Also it would create more severe lithography problems due to sudden Line/Space changes at SG-WL relative to WL-WL.

Figure 2E:
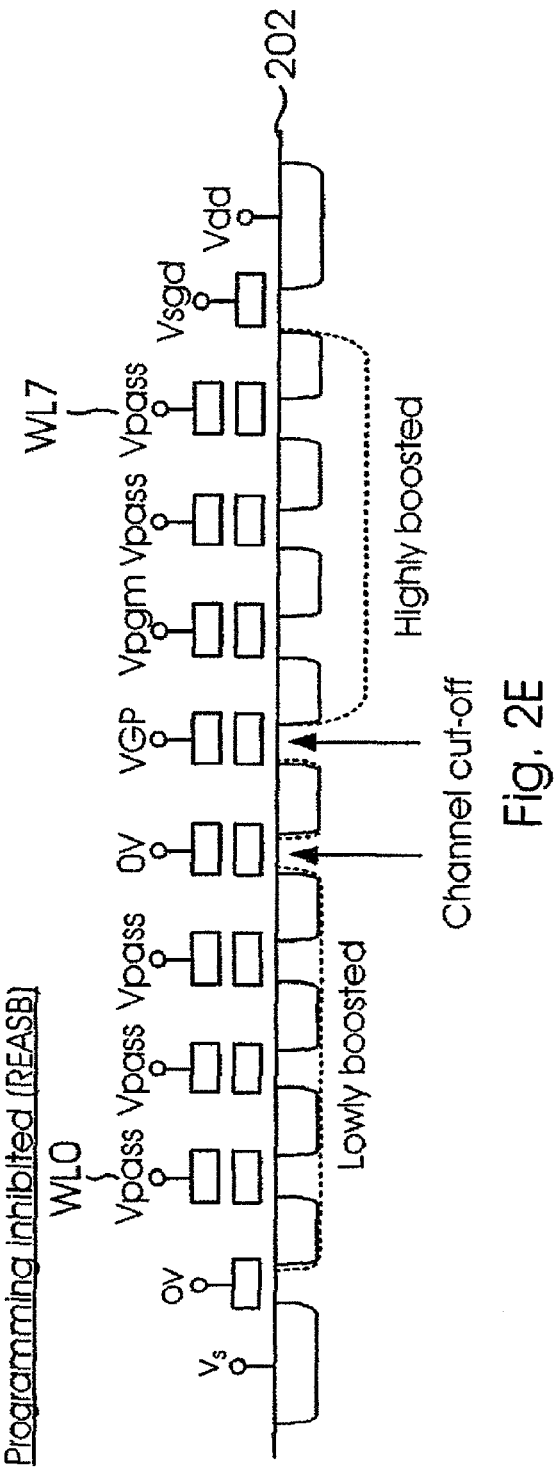
FIG. 2E shows application of an intermediate voltage when a memory cell is being programmed.
Figure 2F:
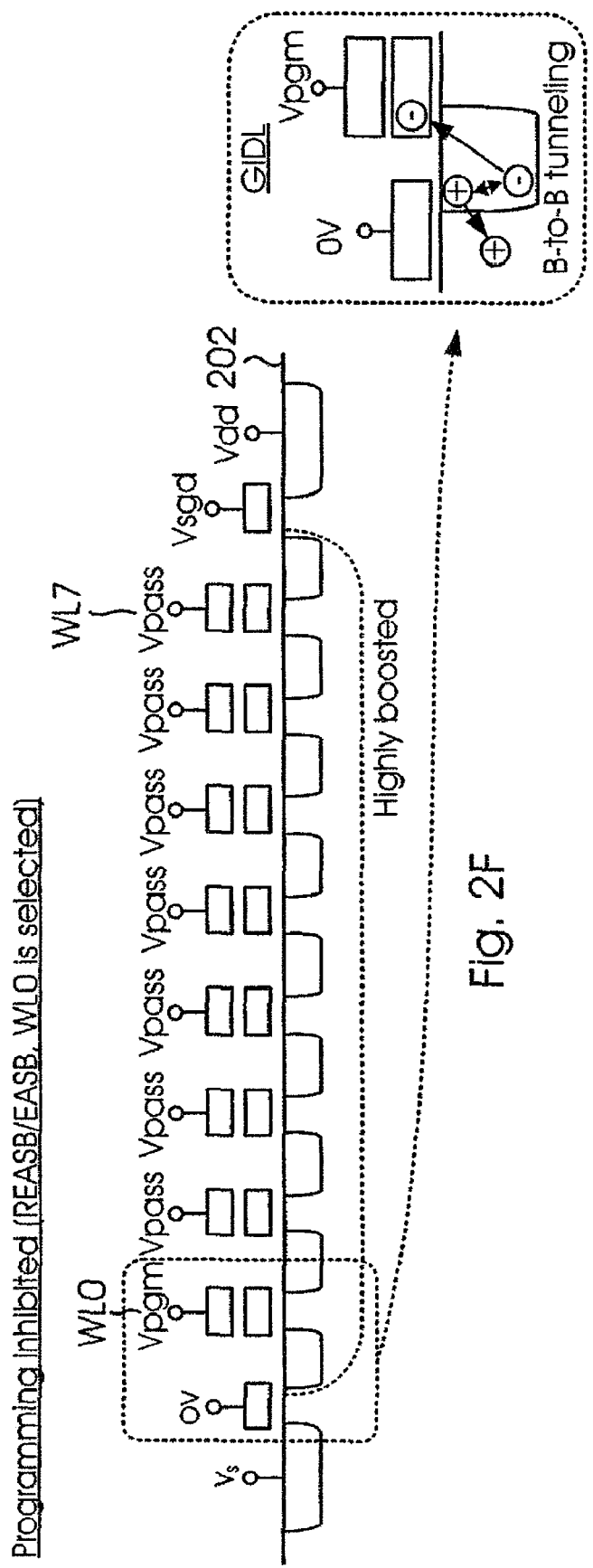
FIG. 2F shows the GIDL effect when word line WL0 is being programmed.

United States Patent Publication No. US-2006-0198195-A1 discloses improved self-boosting method that provides ways to reduce GIDL. The technique is to apply another voltage shown as VGP to the memory cell next to the cell being programmed. This is shown in FIG. 2E, where WL5 is being programmed, VGP is applied to WL4 and zero volt is applied to WL3. In this way, WL voltages around selected WL (VPGM) are gradually lowered. For example, VPGM(24V)–VPASS(10V)–VGP(4V)–VISO(0V). This reduces GIDL while programming WL1 to WLN, where N is the last word line. However, this technique fails when programming WL0, since there is no neighboring word line beyond on the select transistor side. FIG. 2F shows that the problem of GIDL at the end of the string still exists. For example, when Vpgm is applied to WL0 and GIDL still occurs due to band-to-band (B-to-B) tunneling.

U.S. patent application Ser. No. 11/407,816 filed Apr. 20, 2006, entitled "Method and System for Flash Memory Devices" addresses the GIDL problem at the ends of the string by inserting a dummy memory cell between the memory cell located at the end of the string and the select gate there. The dummy memory cell will have its control gate coupled to a dummy word line (WL). By controlling the bias of dummy WLs, GIDL can be reduced in the same way as disclosed in US-2006-0198195-A1. Also the dummy WLs can protect noise between SG-WL. In order to reduce drain side GIDL as well as source side GIDL, two dummy memory cells with two WLs will need to be added on each end of a NAND string. The dummy memory cells do not store any data and this has the disadvantage of further increasing the size of the NAND string.

Adaptive Memory-state Partitioning in a NAND String

A NAND type flash memory is organized into NAND strings with each being a chain of memory cells in series and connected via select transistors on both ends of the string to either a bit line or a source line. The memory cells adjacent both ends of a NAND string are particularly susceptible to errors due to program disturb.

According to a general aspect of the invention, an adaptive memory-state partitioning scheme is employed to overcome the errors on both ends of a NAND string. The memory cells in a NAND string are generally partitioned to store more than one bit of data, except for the ones adjacent both ends where less bits relative to other cells are stored. In this way, the storage of relatively less bits in the memory cells adjacent both ends of a NAND string affords sufficient margin to overcome the errors. For example, in a memory designed to store two bits per cell, one such two bits is respectively stored as individual bit among the two memory cells adjacent both ends.

Flash Memory System

Figure 3A:
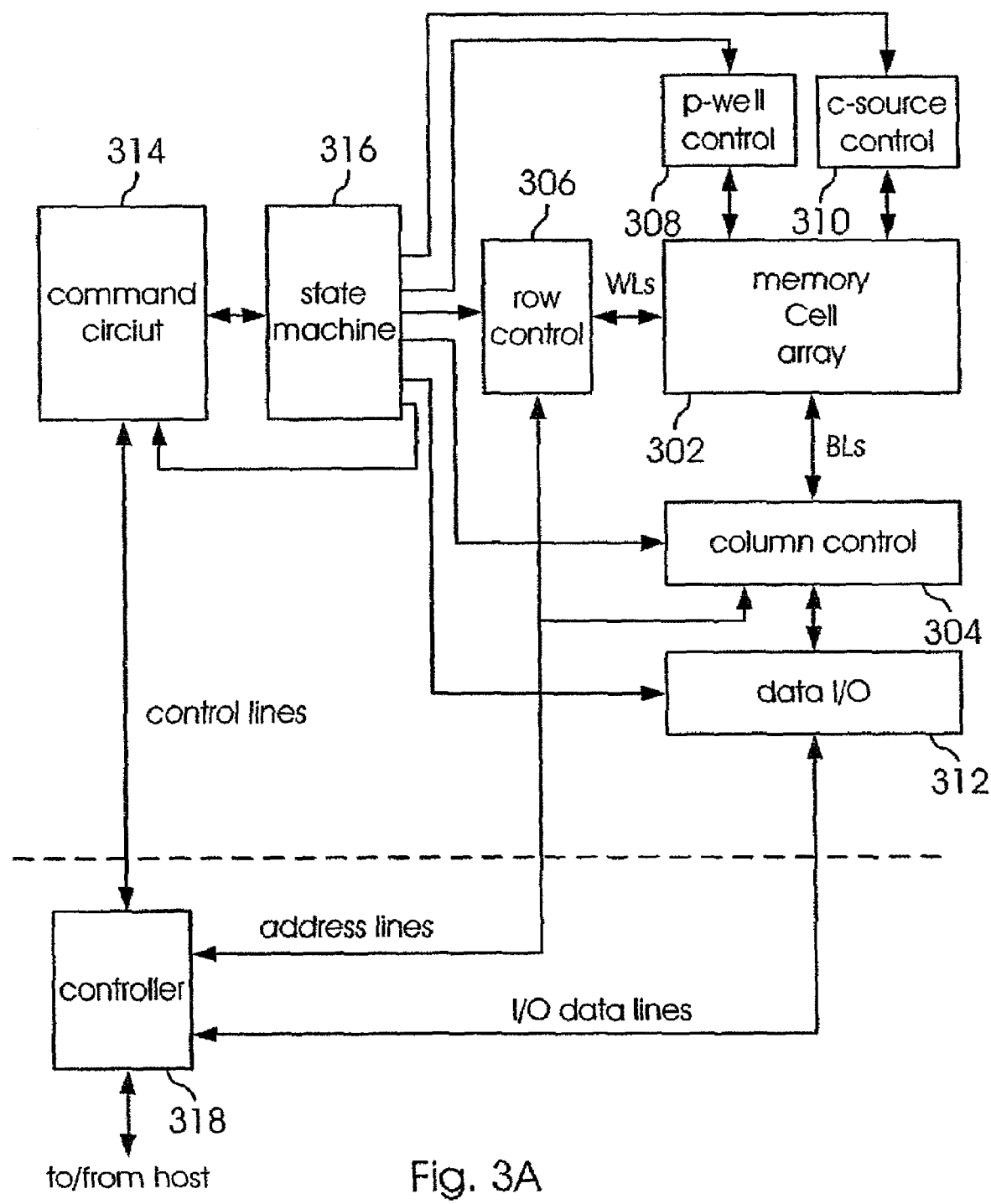
FIG. 3A is a block diagram of one embodiment of a non-volatile memory system in which the various aspects of the present invention are implemented.

FIG. 3A is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply a program voltage combined with the bit line potential levels controlled by column control circuit 304, and to apply an erase voltage. C-source control circuit 310 controls a common source line (labeled as "C-source" in FIG. 3B) connected to the memory cells. P-well control circuit 308 controls the p-well voltage.

The data stored in the memory cells are read by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which are in communication with state machine 316. Controller 318 typically contains buffer memory for the user data being written to or read from the memory array. One exemplar memory system comprises one integrated circuit that includes controller 318, and one or more integrated circuit chips that each contains a memory array and associated control, input/output and state machine circuits. The trend, of course, is to integrate the memory arrays and controller circuits of a system together on one or more integrated circuit chips. The memory system may be embedded as part of the host system or may be included in a memory card (or other package) that is removably inserted into the host systems. Such a card may include the entire memory system (e.g. including the controller) or just the memory array(s) with associated peripheral circuits (with the controller being embedded in the host). Thus, the controller can be embedded in the host or included within a removable memory system.

Figure 3B:
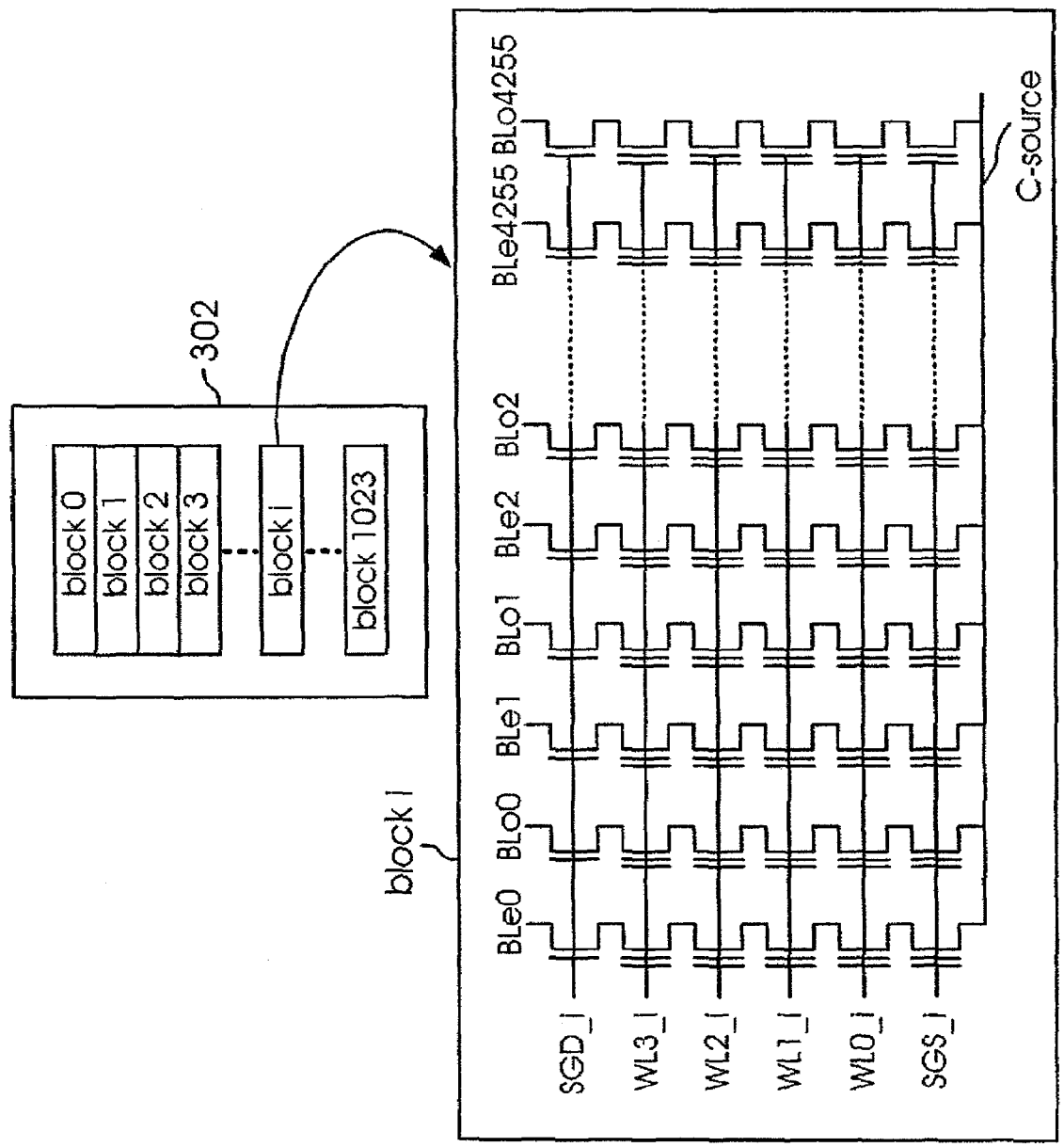
FIG. 3B shows an example of an organization of a memory array.

With reference to FIG. 3B, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 3B, as an example, shows four memory cells connected in series to form a NAND string. Although four cells are shown to be included in each NAND string, more or less than four can be used. For example, a NAND string may contain 32 or more memory cells. One terminal of the NAND string is connected to a corresponding bit line via a first select transistor SGD, and another terminal is connected to c-source via a second select transistor SGS.

During read and programming operations, a page of (e.g., 4,256) memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, one block can store at least eight pages. When each memory cell stores two bits of data (e.g. a multi-level cell), one block stores 16 pages.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation, the selected word line WL2 is grounded, so that it is detected whether the threshold voltage is higher than 0V. In a verify operation, the selected word line WL2 is connected to 2.4V, for example, so that it is verified whether the threshold voltage has reached 2.4V or another threshold level. The source and p-well are at zero volts. The selected even bit lines (BLe) are pre-charged to a level of, for example, 0.7V. If the threshold voltage is higher than the read or verify level, the potential level of the concerned even bit line (BLe) maintains the high level, because of the non-conductive memory cell. On the other hand, if the threshold voltage is lower than the read or verify level, the potential level of the concerned even bit line (BLe) decreases to a low level, for example less than 0.5 V, because of the conductive memory cell. The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

The erase, read and verify operations described above are performed according to techniques known in the art. Thus, many of the details explained can be varied by one skilled in the art.

Examples of Reading and Programming for Multistate Memory

FIGS. 4A-4E and 5A-5E respectively illustrate two examples of multi-bit encoding for a 4-state memory. In a 4-state memory cell, the four states can be represented by two bits. One existing technique is to use a 2-pass programming to program such memory. A first bit (lower page bit) is programmed by a first pass. Subsequently, the same cell is programmed in a second pass to represent a desired second bit (upper page bit). In order not to change the value of the first bit in the second pass, the memory state representation of the second bit is made to depend on the value of the first bit.

FIGS. 4A-4E illustrate the programming and reading of the 4-state memory encoded with a conventional 2-bit Gray code. The memory cell's range of programmable threshold voltages (threshold window) is partitioned into four regions, representing an unprogrammed "U" state, and three other increasingly programmed states, "A", "B" and "C". The four regions are demarcated respectively by demarcation threshold voltages $D_A$, $D_B$ and $D_C$.

Figure 4A:
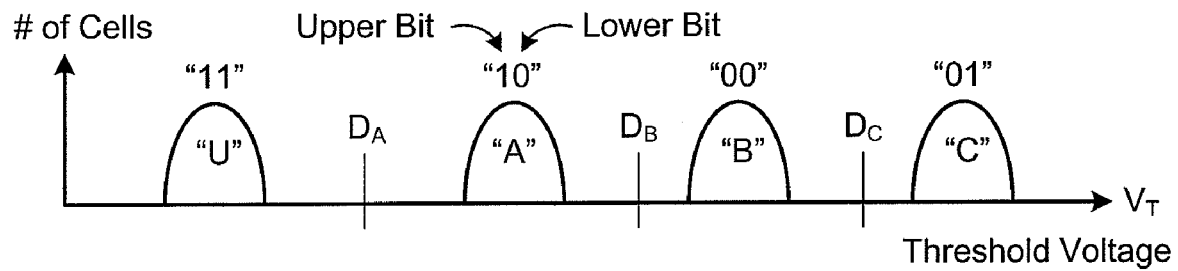
FIG. 4A illustrates threshold voltage distributions of the 4-state memory array when each memory cell stores two bits of data using a conventional Gray code.

FIG. 4A illustrates threshold voltage distributions of the 4-state memory array when each memory cell stores two bits of data using a conventional Gray code. The four distributions represent the population of the four memory states, "U", "A", "B" and "C". Before a memory cell is programmed, it is first erased into its "U" or "unprogrammed" state. The memory states "A", "B" and "C" are progressively reached as the memory cell get increasingly programmed. The Gray code uses the (Upper bit, Lower bit) to designate "U" as (1, 1), "A" as (1, 0), "B" as (0, 0) and "C" as (0, 1).

Figure 4B:
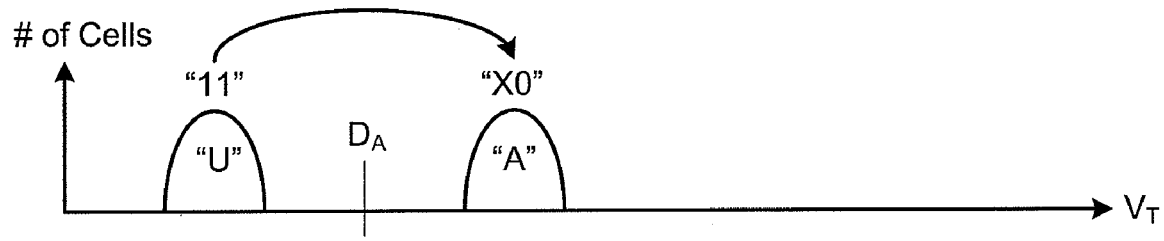
FIG. 4B illustrates the lower page programming in an existing, 2-pass programming scheme using the Gray code.

FIG. 4B illustrates the lower page programming in an existing, 2-pass programming scheme using the Gray code. For a page of cells to be programmed in parallel, the upper and lower bits will give rise to two logical pages: a logical lower page consisting of the lower bits and a logical upper page consisting of the upper bits. A first programming pass only programs the logical lower page bits. By appropriate coding, a subsequent, second programming pass on the same page of cells will program the logical upper page bits without resetting the logical lower page bits. The Gray code is a commonly used code where only one bit changes when transiting to an adjacent state. Therefore, this code has the advantage of placing less demand on error correction since only one bit is involved.

A general scheme in using the Gray code is to let "1" represent a "not program" condition. Thus, the erased memory state "U" is represented by (Upper page bit, Lower page bit)=(1, 1). In a first pass to program the logical lower page, any cell to store the bit "0" will therefore have its logical state transit from (x, 1) to (x, 0), where "x" represent the "don't care" value of the upper bit. However, since the upper bit has not been programmed yet, "x" may as well be labeled by "1" for consistency. The (1, 0) logical state is represented by programming the cell to the memory state "A". That is, prior to a second program pass, the lower bit value of "0" is represented by the memory state "A".

Figure 4C:
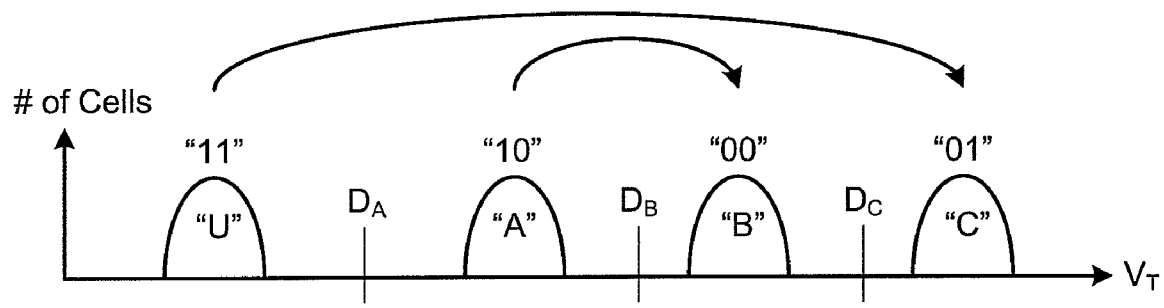
FIG. 4C illustrates the upper page programming in an existing, 2-pass programming scheme using the Gray code.

FIG. 4C illustrates the upper page programming in an existing, 2-pass programming scheme using the Gray code. A second pass programming is performed to store the bits of the logical upper page. Only those cells needing an upper page bit value of "0" will be programmed. After the first pass, the cells in the page are either in the logical state (1, 1) or (1, 0). In order to preserve the values of the lower page in the second pass, the lower bit value of "0" or "1" need to be distinguished. For the transition from (1, 0) to (0, 0) the memory cell in question is programmed to the memory state "B". For the transition from (1, 1) to (0, 1) the memory cell in question is programmed to the memory state "C". In this way, during read, by determining the memory state programmed in a cell, both the lower page bit and the upper page bit can be decoded.

Programming is accomplished by alternately applying a programming pulse to a page of memory cells in parallel followed by sensing or program verifying on each of the cells to determine if any of them has been programmed to their target states. Whenever a cell has been program verified, it is locked out or program inhibited from further programming even as the programming pulses continue to be applied to complete the programming of the other cells in the group. It can be seen from FIGS. 4B and 4C that during the lower page programming, program verification need be performed relative to state "A" (denoted by "verifyA") with the demarcation threshold voltage $D_A$. However, for the upper page programming, program verification need be performed relative to states "B" and "C". Thus, the upper page verify will require a 2-pass verify of "verifyB and "verifyC", respectively relative to the demarcation threshold voltages $D_B$ and $D_C$.

Figure 4D:
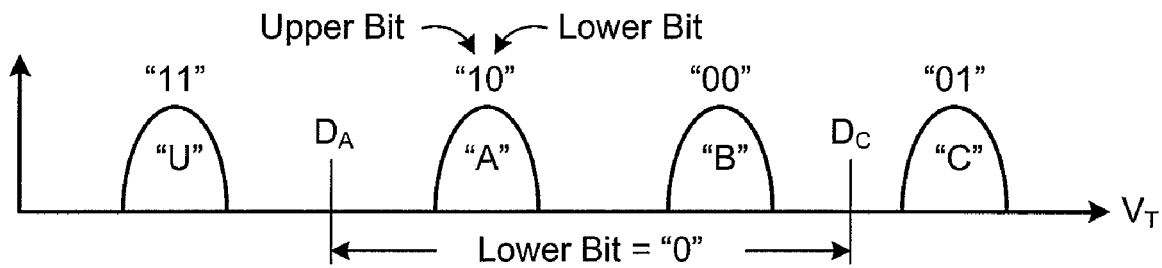
FIG. 4D illustrates the read operation that is required to discern the lower bit of the 4-state memory encoded with the Gray code.

FIG. 4D illustrates the read operation that is required to discern the lower bit of the 4-state memory encoded with the Gray code. Since the memory states "A" encoded by (1, 0) and "B" encoded by (0, 0) both have "0" as their lower bits, the lower bit "0" will be detected whenever a memory cell is programmed to either states "A" or "B". Conversely, the lower bit "1" will be detected whenever a memory cell is unprogrammed at state "U" or programmed to state "C". Thus, the lower page read will require a 2-pass read of readA and readC, respectively relative to the demarcation threshold voltages $D_A$ and $D_C$.

Figure 4E:
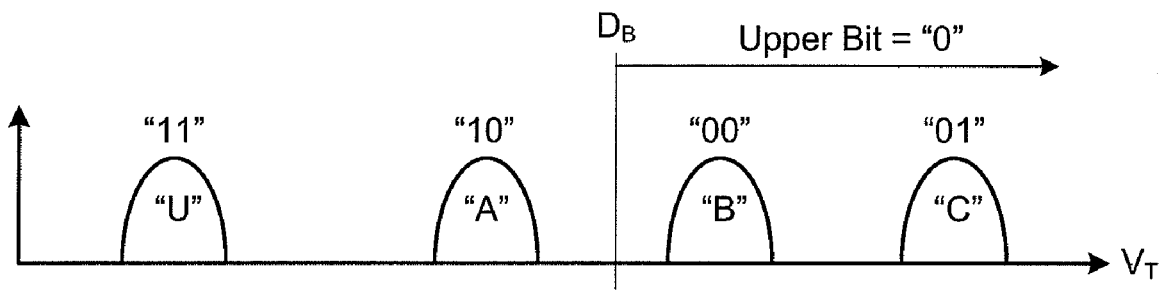
FIG. 4E illustrates the read operation that is required to discern the upper bit of the 4-state memory encoded with the Gray code.

FIG. 4E illustrates the read operation that is required to discern the upper bit of the 4-state memory encoded with the Gray code. It will require one read pass of readB relative to the demarcation threshold voltage $D_B$. In this way, any cells with programmed threshold voltages less than $D_B$ will be detected to be at memory state "1" and vice versa.

The Gray-code, 2-pass programming scheme can become a problem when the second-pass programming is erroneous. For example, the programming of the upper page bit to "0" while the lower bit is at "1" will cause the transition from (1, 1) to (0, 1). This requires the memory cell to be progressively programmed from "U" through "A" and "B" to "C". If there is a power outage before the completion of the programming, the memory cell may end up in one of the transition memory state, say "A". When the memory cell is read, "A" will be decoded as the logical state (1, 0). This gives incorrect results for both the upper and lower bits, since it should have been (0, 1). Similarly, if the programming is interrupted when "B" is reached, it would correspond to (0, 0). While the upper bit is now correct, the lower bit is still wrong. Furthermore, because of the possible transition from the unprogrammed state "U" all the way to the most programmed state "C", this code scheme has the effect of exacerbating the potential differences between charge levels of adjacent cells programmed at different times. Thus, it also exacerbates the field-effect coupling ("Yupin Effect") between adjacent floating gates.

FIGS. 5A-5E illustrate the programming and reading of the 4-state memory encoded with another logical code ("LM" code). This code provides more fault-tolerance and alleviates the neighboring cell coupling due to the Yupin Effect.

Figure 5A:
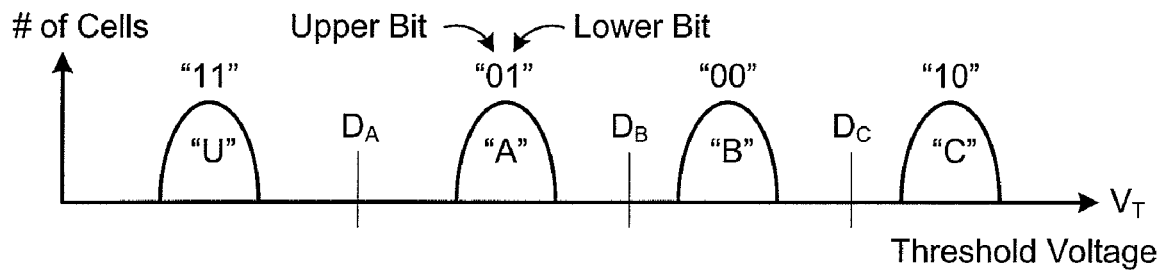
FIG. 5A illustrates threshold voltage distributions of the 4-state memory array when each memory cell stores two bits of data using the LM code.

FIG. 5A illustrates threshold voltage distributions of the 4-state memory array when each memory cell stores two bits of data using the LM code. The LM coding differs from the conventional Gray code shown in FIG. 7A in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges. As will be seen in FIGS. 5B and 5C, each programming operation results in moderate change in the charges in the charge storage unit as evident from the moderate change in the threshold voltages VT.

The coding is designed such that the 2 bits, lower and upper, may be programmed and read separately. When programming the lower bit, the threshold level of the cell either remains in the unprogrammed region or is moved to a "lower middle" region of the threshold window. When programming the upper bit, the threshold level in either of these two regions is further advanced to a slightly higher level not more than one quarter of the threshold window.

Figure 5B:
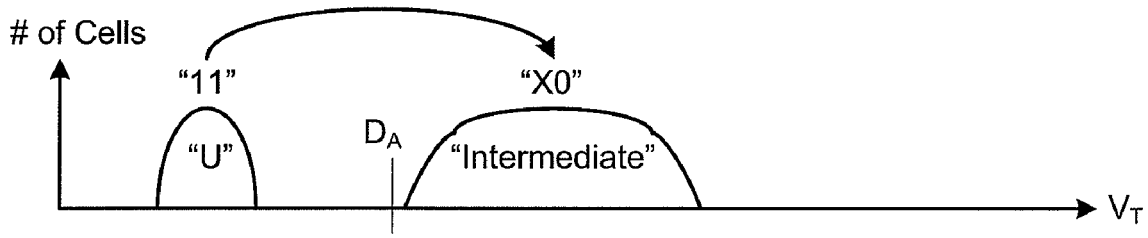
FIG. 5B illustrates the lower page programming in an existing, 2-round programming scheme using the LM code.

FIG. 5B illustrates the lower page programming in an existing, 2-round programming scheme using the LM code. The fault-tolerant LM code essentially avoids any upper page programming to transit through any intermediate states. Thus, the first round lower page programming has the logical state (1, 1) transits to some intermediate state (x, 0) as represented by programming the "unprogrammed" memory state "U" to an "intermediate" state designated by (x, 0) with a programmed threshold voltage among a broad distribution that is greater than $D_A$ but less than $D_C$. During programming, the intermediate state is verified relative a demarcation $DV_A$.

Figure 5C:
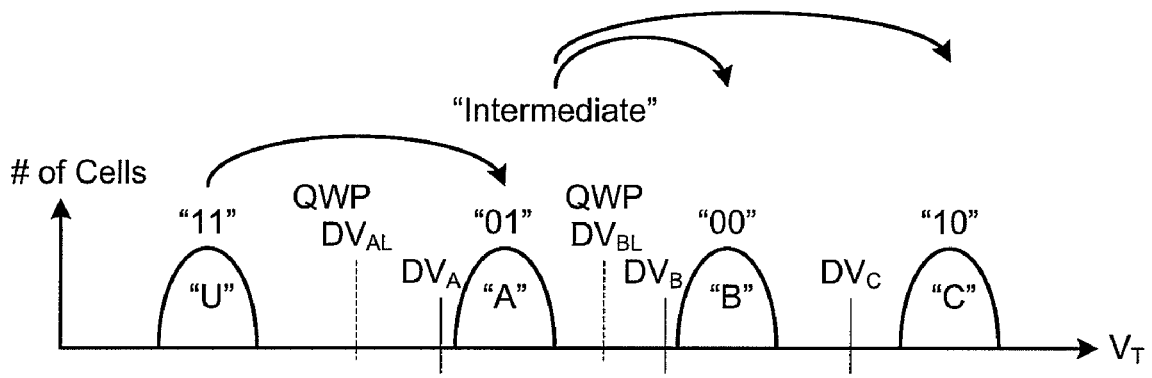
FIG. 5C illustrates the upper page programming in an existing, 2-round programming scheme using the LM code.

FIG. 5C illustrates the upper page programming in an existing, 2-round programming scheme using the LM code. In the second round of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "B". Similarly, if the upper page is to remain at "1", while the lower page has been programmed to "0", it will require a transition from the "intermediate" state to (1, 0) as represented by programming the "intermediate" state to "C". Since the upper page programming only involves programming to the next adjacent memory state, no large amount of charges is altered from one round to another. The lower page programming from "U" to a rough "intermediate" state is designed to save time.

Figure 5D:
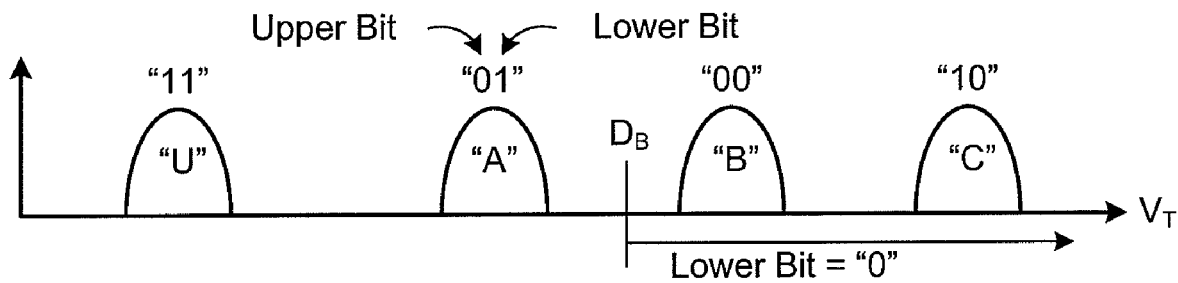
FIG. 5D illustrates the read operation that is required to discern the lower bit of the 4-state memory encoded with the LM code.

FIG. 5D illustrates the read operation that is required to discern the lower bit of the 4-state memory encoded with the LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page is programmed to the "intermediate" state (FIG. 5B), and readB will cause error. Rather, reading the lower page will require one read pass of readA relative to the demarcation threshold voltage $D_A$. In order to distinguish the two cases, a flag ("LM" flag) is written in the upper page when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 5E:
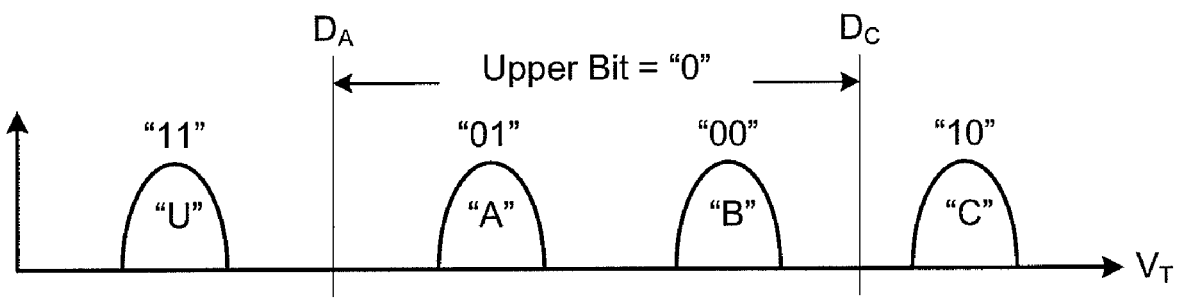
FIG. 5E illustrates the read operation that is required to discern the upper bit of the 4-state memory encoded with the LM code.

FIG. 5E illustrates the read operation that is required to discern the upper bit of the 4-state memory encoded with the LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

FIG. 6A illustrates the effect of GIDL induced errors among the various memory cells in a conventional NAND string. The example shows a NAND string having 32 memory cells in series and associated with word lines WL0-WL31. Each memory cell is partitioned to store one of four possible memory states (represented by 2 bits). FIG. 6A shows the distribution of threshold voltages for the four memory states for three locations of memory cells of the NAND string for a population of memory cells. Two of the three locations are adjacent to the select transistors (or gates). In particular, the memory cell adjacent to the source end of the string has its control gate connected to word line WL0 and the memory cell adjacent to the drain end of the string has its control gate connected to word line WL31. The rest of the memory cells resides in the core region of the NAND string and is associated with word lines WL1-WL30.

It will be seen from FIG. 6A that the normal distribution (middle graph) of the four memory states is given by the memory cells residing in the core region (WL1-WL30). However, due to pronounced GIDL effects at the end of the NAND string, the distribution (bottom graph) for the memory cell (WL0) adjacent to the source select transistor is shifted to higher threshold voltages. This can produce errors as for example, the shifted "01" state may be erroneously read as a "00" state. Similarly, the same error affects the memory cell (WL31) adjacent to the drain select transistor (see top graph.)

FIG. 6B illustrates the memory-state partitioning of each of the memory cells in a typical NAND string associated with FIG. 6A. The example given is a 32-cell NAND string in the column direction of a memory array. A bank of the NAND strings in the row direction forms a page of NAND string. A word line is coupled to all the control gates of each memory cell along each row. Thus, each NAND string will have word lines WL0 to WL31 plus select line SGS and SGD for the two rows of select transistors located at either ends of the bank of NAND strings. A page of memory cells is programmed or read in parallel. In one embodiment, a (even) page is formed by a row of memory cells among even columns and a (odd) page is formed by a row of memory cells among odd columns. In another embodiment, a full page is formed by a contiguous run of memory cells along a row or portion thereof.

In the conventional scheme shown in FIG. 6B, each memory cell is partitioned to store one of four possible memory states. The four possible memory states are coded in two bits as illustrated by the examples given in FIGS. 4A-4E and FIGS. 5A-5E. The two logical bits can be denoted as a lower bit ("L") and an upper bit ("U"). Thus, each memory cells in a NAND string is configured to store two bits of data, namely "L/U".

Figure 7A:
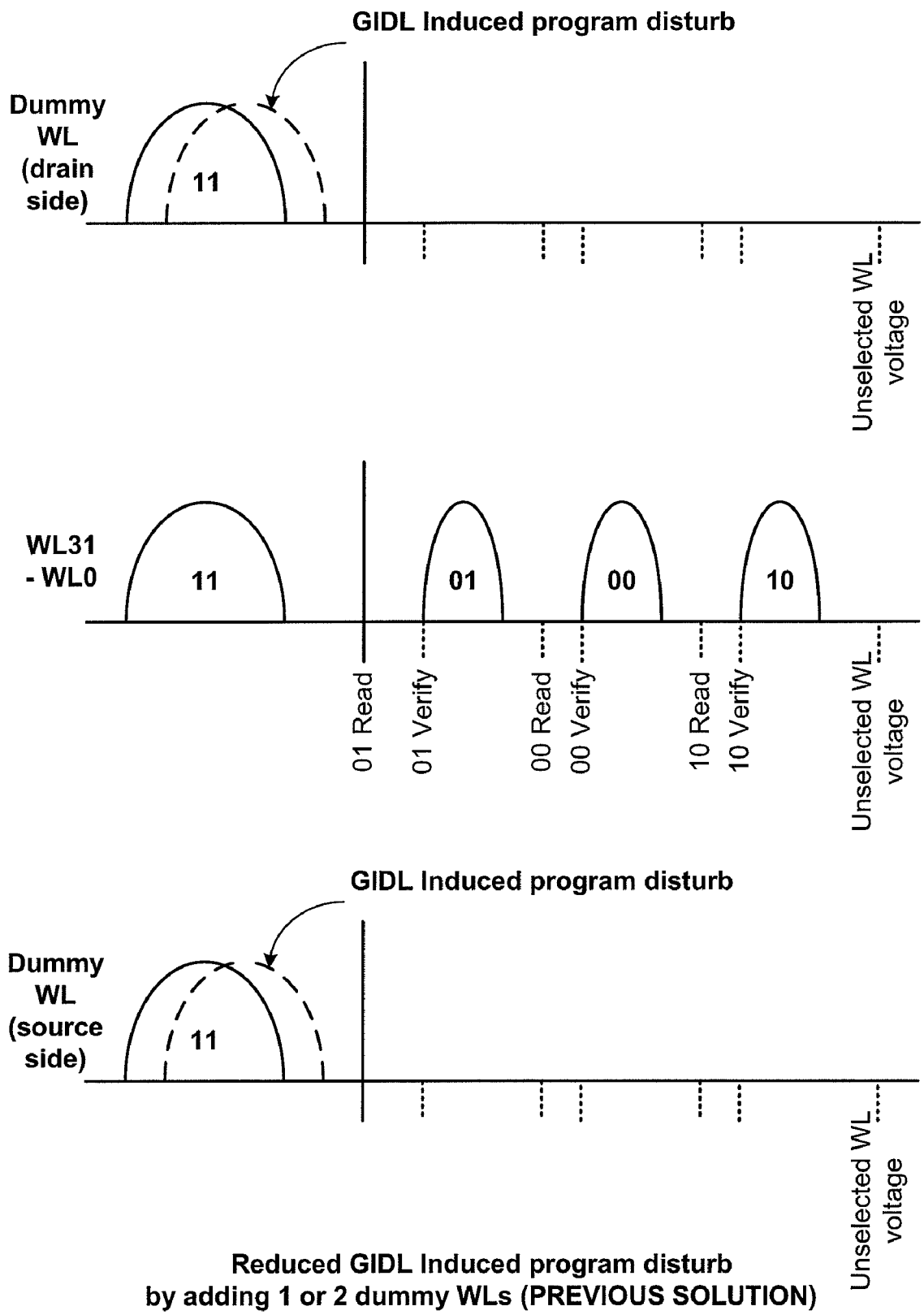
FIG. 7A illustrates a previous solution of introducing additional dummy memory cells at the ends of the memory cell chain in a NAND string.

FIG. 7A illustrates a previous solution of introducing additional dummy memory cells at the ends of the memory cell chain in a NAND string. Since the dummy memory cells are now adjacent the select transistors and the ends of the NAND string, they will experience the most GIDL effect (see top and bottom graphs.) However, the effect on these dummy cells does not matter as the dummy cells are not used to store any data. At the same time intermediate voltages can be applied to the word lines of the dummy cells in a manner similar to the scheme proposed in US-2006-0198195-A1 in order to alleviate the GIDL effect. Thus, the memory cells connected to WL0-WL31 will not be affected (see middle graph.)

FIG. 7B illustrates the memory-state partitioning of each of the memory cells in a typical NAND string with the addition of a dummy cell similar to that of FIG. 7A. The regular memory cells (WL0-WL31) in the NAND string will each be configured to store both lower and upper bits of the 2-bit data. The additional dummy cell will not be programmed.

FIG. 7C illustrates the memory-state partitioning of each of the memory cells in a typical NAND string with the addition of two dummy cells similar to that of FIG. 7A. The regular memory cells (WL0-WL31) in the NAND string will each be configured to store both lower and upper bits of the 2-bit data. The additional dummy cells, at both ends of the memory cell chain, will not be programmed.

Adaptive Memory-State Partitioning

Figure 8A:
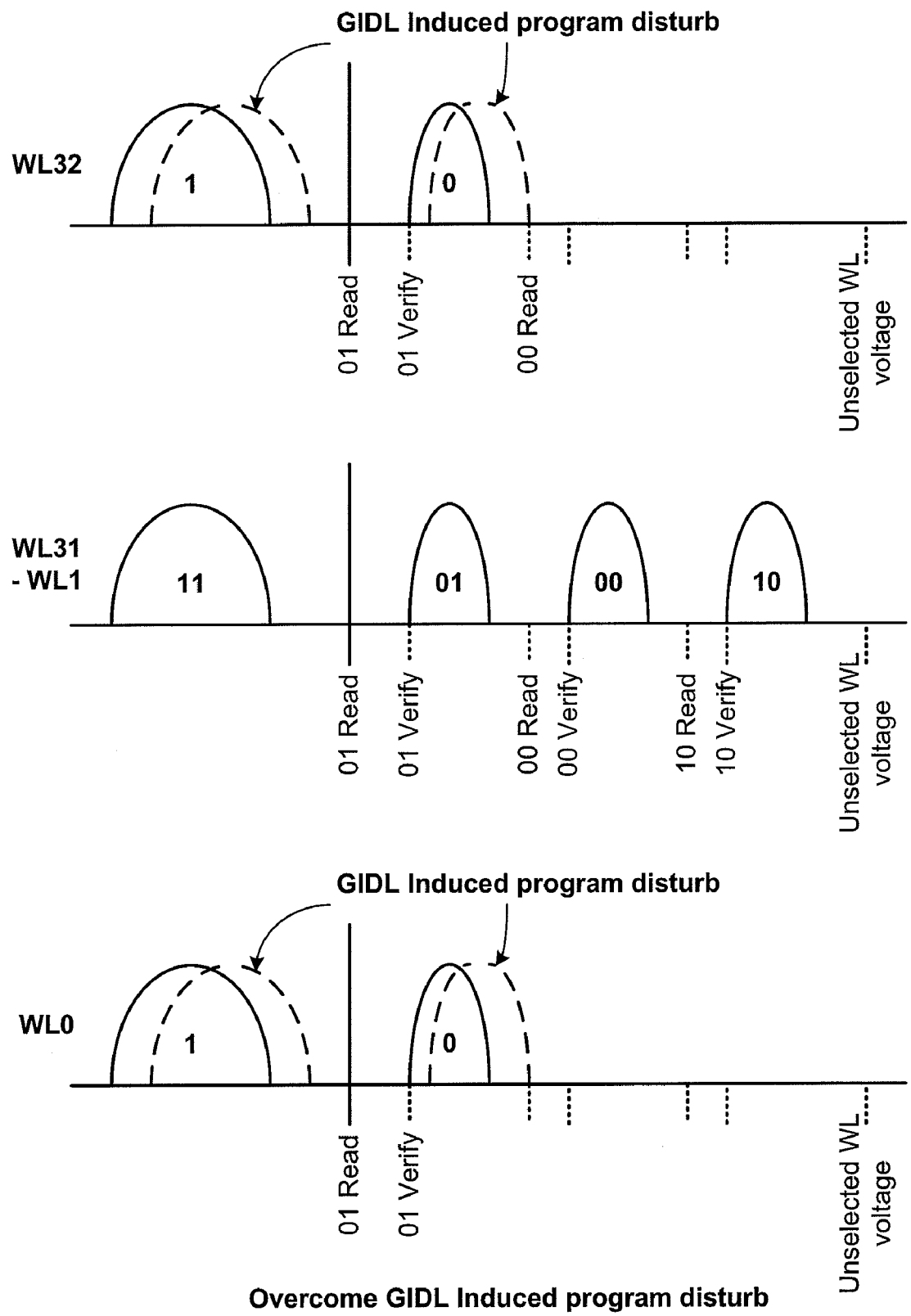
FIG. 8A illustrates a scheme of overcoming the GIDL errors for the end memory cells of a NAND string, according to a general embodiment of the invention.

FIG. 8A illustrates a scheme of overcoming the GIDL errors for the end memory cells of a NAND string, according to a general embodiment of the invention. Essentially, a minimum of change is needed from the conventional case shown in FIG. 6A. The main difference is that the memory cells at the end of the NAND string are configured to store binary data instead of multi-state data. The end memory cells (e.g., WL0 and WL32) have their threshold window partitioned with the two states spaced more apart than the four-state case so that the extra margin will allow the two states to be distinguishable in spite of the GIDL induced errors at the ends of the NAND string. If the conventional NAND string is specified to have 32 cells each able to store a 2-bit data (32×2=64 bits per string), then the current scheme needs only add an additional memory cell to the chain so that the same 64-bit capacity is now provided by (31×2+2×1 bits per string.)

FIG. 8B illustrates the memory-state partitioning of each of the memory cells in a typical NAND string with the adaptive memory-state partitioning scheme of FIG. 8A. The core memory cells (WL1-WL31) in the NAND string will each be configured normally to store both lower and upper bits of the 2-bit data. The two end cells (WL0 and WL32) will each be configured to store binary data with a bigger margin between the states as compared to the normal case.

FIG. 8C illustrates an alternate preferred scheme using the 2-bit LM coding described in FIGS. 5A-5E. In the LM coding described in FIGS. 5A-5E, the 2-bits can be programmed in two separate passes. The first pass for programming the lower logical bit and the second pass for programming also the upper logical bit on the same memory cell. The nature of the LM coding is such that the lower bit partitioning has a wider margin than that of the upper bit or combined 2-bit. Thus, the lower bit programming is more robust in view of disturbance as compared to the upper bit. In order to have a minimum of change from an existing memory system, the programming of the binary bit for the two end cells in a NAND chain is preferably employing the lower bit (or page) programming of the LM code. However, it will be understood that one of the binary bit is used to represent the lower bit of the 2-bit LM code and the other binary bit is used to represent the upper bit the 2-bit LM code.

Figure 9:
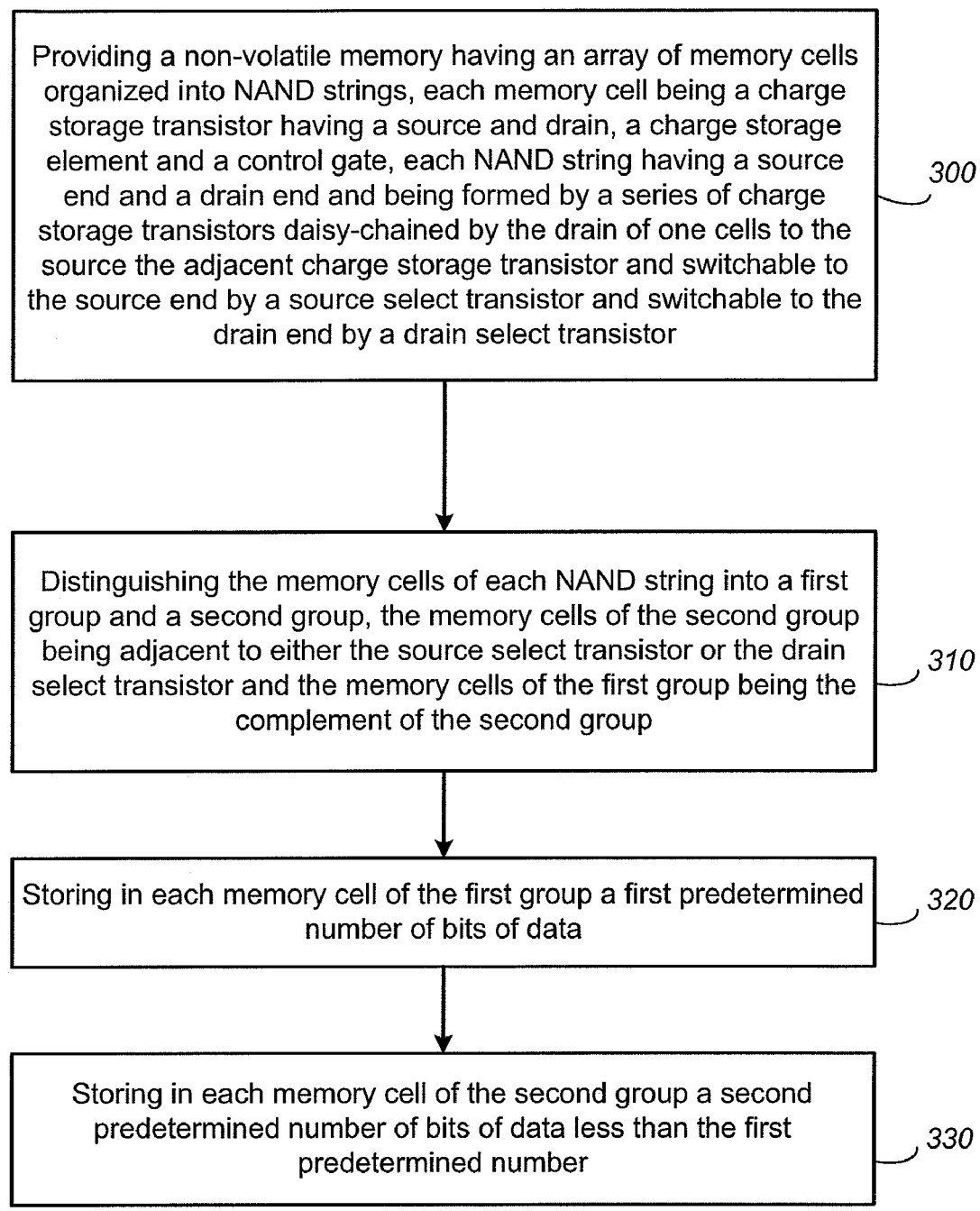
FIG. 9 is a flow diagram illustrating the adaptive memory partitioning scheme.

FIG. 9 is a flow diagram illustrating the adaptive memory partitioning scheme.

STEP 300: Providing a non-volatile memory having an array of memory cells organized into NAND strings, each memory cell being a charge storage transistor having a source and drain, a charge storage element and a control gate, each NAND string having a source end and a drain end and being formed by a series of charge storage transistors daisy-chained by the drain of one cells to the source the adjacent charge storage transistor and switchable to the source end by a source select transistor and switchable to the drain end by a drain select transistor;

STEP 310: Distinguishing the memory cells of each NAND string into a first group and a second group, the memory cells of the second group being adjacent to either the source select transistor or the drain select transistor and the memory cells of the first group being the complement of the second group;

STEP 320: Storing in each memory cell of the first group a first predetermined number of bits of data; and STEP 330: Storing in each memory cell of the second group a second predetermined number of bits of data less than the first predetermined number.

In one embodiment, where a memory is designed to store two bits per cell, one unit of such two bits is able to have one of the two bits stored in a memory cell adjacent to one end of a NAND string and another of the two bits stored in another memory cell adjacent the other end.

In another embodiment, where a memory is designed to store three bits per cell, one unit of such three bits is able to have one end memory cell stores two of the bits and the other end memory cell stores one of the bits.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

While the invention has been described above by reference to various embodiments, it will be understood that changes and modifications may be made without departing from the scope of the invention, which is to be defined only by the appended claims and their equivalent. All references referred to herein are incorporated herein by reference.

What is claimed is:

1. A non-volatile memory comprising:
    an array of memory cells organized into NAND strings,
    each memory cell being a charge storage transistor having a source and drain, a charge storage element and a control gate,
    each NAND string having a source end and a drain end and being formed by a series of charge storage transistors daisy-chained by the drain of one cell to the source of the adjacent charge storage transistor and switchable to the source end by a source select transistor and switchable to the drain end by a drain select transistor, and wherein:
    each NAND string consists of a first group and a second group of memory cells, with the second group of memory cells being adjacent to either the source select transistor or the drain select transistor and the first group of memory cells being the complement of the second group in the NAND string;
    means for storing in each memory cell of the first group a first predetermined number of bits of data; and
    means for storing in each memory cell of the second group a second predetermined number of bits of data less than the first predetermined number.

2. The memory as in claim 1, wherein said means for storing is by programming in parallel a page of memory cells with a common word line among a corresponding page of NAND strings.

3. The memory as in claim 2, wherein the page of memory cells are initially erased by having charges removed from their charge storage elements.

4. The memory as in claim 1, wherein the first predetermined number of bits of data is 2-bit data.

5. The memory as in claim 4, wherein the second group of memory cells contains two memory cells each for storing one of the bits of the 2-bit data.

6. The memory as in claim 4, wherein:
    the 2-bit data consists of a logical first bit and a logical second bit; and
    the second group contains two memory cells, one for storing the logical first bit and the other one for storing the logical second bit.

7. The memory as in claim 6, wherein the second group contains two memory cells each for storing one of the logical bits of the 2-bit data.

8. The memory as in claim 1, wherein the first predetermined number of bits of data is 3-bit data.

9. The memory as in claim 8, wherein the second group of memory cells contains two memory cells each for storing one or two bits of the 3-bit data.

10. The memory as in claim 8, wherein:
    the 3-bit data consists of a logical first bit, a logical second bit and a logical third bit; and
    the second group contains two memory cells, one for storing the logical first bit and the other one for storing the logical second and third bits.

11. The memory as in claim 10, wherein the second group contains two memory cells each for storing one or two of the logical bits of the 3-bit data.

12. A non-volatile memory comprising:
    an array of memory cells organized into NAND strings,
    each memory cell being a charge storage transistor having a source and drain, a charge storage element and a control gate,
    each NAND string having a source end and a drain end and being formed by a series of charge storage transistors daisy-chained by the drain of one cell to the source of the adjacent charge storage transistor and switchable to the source end by a source select transistor and switchable to the drain end by a drain select transistor, and wherein:
    each NAND string consists of a first group and a second group of memory cells, with the second group of memory cells being adjacent to either the source select transistor or the drain select transistor and the first group of memory cells being the complement of the second group in the NAND string;
    the memory cells of the first group are configured to be programmable to one of a first predetermined number of memory states; and
    the memory cells of the second group are configured to be programmable to one of a second predetermined number memory states, the second predetermined number being less than the first predetermined number.

13. The memory as in claim 12, wherein a page of memory cells with a common word line among a corresponding page of NAND strings is programmed and read as a unit.

14. The memory as in claim 13, wherein the page of memory cells are initially erased by having charges removed from their charge storage elements.

15. The memory as in claim 12, wherein the first predetermined number of bits of data is 2-bit data.

16. The memory as in claim 15, wherein the second group of memory cells contains two memory cells each for storing one of the bits of the 2-bit data.

17. The memory as in claim 15, wherein:
the 2-bit data consists of a logical first bit and a logical second bit; and
the second group contains two memory cells, one for storing the logical first bit and the other one for storing the logical second bit.

18. The memory as in claim 17, wherein the second group contains two memory cells each for storing one of the logical bits of the 2-bit data.

19. The memory as in claim 12, wherein the first predetermined number of bits of data is 3-bit data.

20. The memory as in claim 19, wherein the second group of memory cells contains two memory cells each for storing one or two bits of the 3-bit data.

21. The memory as in claim 19, wherein:
the 3-bit data consists of a logical first bit, a logical second bit and a logical third bit; and
the second group contains two memory cells, one for storing the logical first bit and the other one for storing the logical second and third bits.

22. The memory as in claim 21, wherein the second group contains two memory cells each for storing one or two of the logical bits of the 3-bit data.

* * * * *